US012765308B2

(12) United States Patent
Marumoto

(10) Patent No.: US 12,765,308 B2

(45) Date of Patent: Oct. 13, 2026

(54) SUBSTRATE PROCESSING APPARATUS AND SUBSTRATE PROCESSING METHOD

(71) Applicant: Tokyo Electron Limited, Tokyo (JP)

(72) Inventor: Hiroshi Marumoto, Koshi City (JP)

(73) Assignee: TOKYO ELECTRON LIMITED, Tokyo (JP)

(*) Notice: Subject to any disclaimer, the term of this patent is extended or adjusted under 35 U.S.C. 154(b) by 560 days.

(21) Appl. No.: 18/188,585

(22) Filed: Mar. 23, 2023

(65) Prior Publication Data

US 2023/0307270 A1 Sep. 28, 2023

(30) Foreign Application Priority Data

Mar. 24, 2022 (JP) ................................ 2022-048695

(51) Int. Cl.

| | |
|---|---|
| ***H01L 21/67*** | (2006.01) |
| ***B08B 3/04*** | (2006.01) |
| ***B08B 13/00*** | (2006.01) |
| ***G06T 7/00*** | (2017.01) |
| ***H10P 72/00*** | (2026.01) |

(52) U.S. Cl.

CPC ................ *H10P 72/06* (2026.01); *B08B 3/04* (2013.01); *B08B 13/00* (2013.01); *G06T 7/0008* (2013.01); *H10P 72/0404* (2026.01); *G06T 2207/30148* (2013.01)

(58) Field of Classification Search

CPC ......... H01L 21/67242; H01L 21/67017; H01L 21/68714; G06T 2207/30164; G06T 7/001; H10P 72/06; H10P 72/0404; H10P 72/0402; H10P 72/7604; H10P 74/203

See application file for complete search history.

(56) References Cited

U.S. PATENT DOCUMENTS

| | | | | |
|---|---|---|---|---|
| 5,444,637 | A * | 8/1995 | Smesny | H01L 22/34 700/121 |
| 5,871,584 | A | 2/1999 | Tateyama et al. | |
| 6,656,273 | B1 * | 12/2003 | Toshima | H01L 21/6715 118/66 |
| 9,355,442 | B2 * | 5/2016 | Iwanaga | G06T 7/0004 |
| 10,748,798 | B1 * | 8/2020 | Tsai | C23C 14/54 |

(Continued)

FOREIGN PATENT DOCUMENTS

| | | | |
|---|---|---|---|
| JP | H11-329936 | A | 11/1999 |
| KR | 10-2018-0034438 | A | 4/2018 |

*Primary Examiner* — Jarrett J Stark

(74) *Attorney, Agent, or Firm* — Chrisman Gallo Tochtrop LLC

(57) ABSTRACT

A substrate processing apparatus includes an inspection substrate including a base and an imaging unit disposed at the base; a holder configured to hold a substrate or the inspection substrate; a driving unit configured to rotate the holder; a processing liquid supply configured to supply a processing liquid to the substrate held by the holder; a cup member configured to surround the holder; and a controller. The controller is configured to perform: adjusting a position of the imaging unit with respect to the cup member to a predetermined first imaging position in a state that the inspection substrate is held by the holder; and imaging, after the adjusting of the position of the imaging unit to the first imaging position, an imaging target that is located in a space closer to the cup member than to an outer periphery of the base at the first imaging position.

20 Claims, 10 Drawing Sheets

(56) References Cited

U.S. PATENT DOCUMENTS

| | | | | |
|---|---|---|---|---|
| 11,131,025 | B2 * | 9/2021 | Tsai | G06T 7/0004 |
| 11,984,340 | B2 * | 5/2024 | Shindo | H01L 21/67259 |
| 2001/0003968 | A1 * | 6/2001 | Kitano | H01L 21/6715 118/313 |
| 2006/0000964 | A1 * | 1/2006 | Ye | G03F 7/7085 250/208.1 |
| 2007/0122752 | A1 * | 5/2007 | Asako | H01L 21/76814 430/313 |
| 2008/0045025 | A1 * | 2/2008 | Asako | H01L 21/31058 257/E21.214 |
| 2008/0057728 | A1 * | 3/2008 | Shimura | H01L 21/76808 257/E21.252 |
| 2009/0291198 | A1 * | 11/2009 | Yoshihara | H01L 21/6715 427/299 |
| 2016/0089688 | A1 * | 3/2016 | Uemae | B05D 1/02 118/712 |
| 2019/0019701 | A1 * | 1/2019 | Hayakawa | G03F 7/091 |
| 2019/0172742 | A1 * | 6/2019 | Mochizuki | H01L 21/681 |
| 2020/0111715 | A1 * | 4/2020 | Naohara | G06T 7/0004 |
| 2021/0005487 | A1 * | 1/2021 | Tsai | C23C 16/45565 |
| 2021/0278768 | A1 * | 9/2021 | Sakata | H01L 21/67276 |
| 2022/0319886 | A1 * | 10/2022 | Maki | H01L 21/68742 |
| 2022/0319893 | A1 * | 10/2022 | Maki | H01L 22/34 |
| 2023/0307270 | A1 * | 9/2023 | Marumoto | G06T 7/001 |
| 2023/0307271 | A1 * | 9/2023 | Marumoto | B08B 13/00 |
| 2024/0047244 | A1 * | 2/2024 | Yoshimura | H01L 21/02052 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2022-048695 filed on Mar. 24, 2022, the entire disclosure of which is incorporated herein by reference.

TECHNICAL FIELD

The various aspects and embodiments described herein pertain generally to a substrate processing apparatus and a substrate processing method.

BACKGROUND

Patent Document 1 discloses a substrate processing apparatus including a holder configured to hold a substrate, a scattering prevention cup disposed around the holder, a processing liquid supply nozzle configured to supply a processing liquid to the substrate held by the holder, an imaging device disposed above the processing liquid supply nozzle and the scattering prevention cup to image a supply path for the processing liquid between the processing liquid supply nozzle and a surface of the substrate, and a control device configured to perform a predetermined operation when a supply state of the processing liquid obtained by the imaging device is abnormal.

Patent Document 1: Japanese Patent Laid-open Publication No. H11-329936

SUMMARY

In one exemplary embodiment, a substrate processing apparatus includes an inspection substrate including a base and an imaging unit disposed at the base; a holder configured to hold a substrate or the inspection substrate; a driving unit configured to rotate the holder; a processing liquid supply configured to supply a processing liquid to the substrate held by the holder; a cup member configured to surround the holder from an outside thereof; and a controller. The controller is configured to perform: adjusting a position of the imaging unit with respect to the cup member to a predetermined first imaging position by controlling the driving unit to rotate the holder in a state that the inspection substrate is held by the holder; and imaging, after the adjusting of the position of the imaging unit to the first imaging position, an imaging target that is located in a space closer to the cup member than to an outer periphery of the base at the first imaging position by controlling the imaging unit.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A is a side view schematically illustrating a part of the liquid processing unit, and FIG. 7B is a diagram showing an example of an image prepared by developing an image taken over the substantially entire circumference of the cup member into a plane;

FIG. 8A is a side view schematically illustrating a part of the liquid processing unit, and FIG. 8B is a diagram illustrating an example of an image prepared by developing an image taken over the substantially entire circumference of the cup member into a plane;

DETAILED DESCRIPTION

Figure 1:
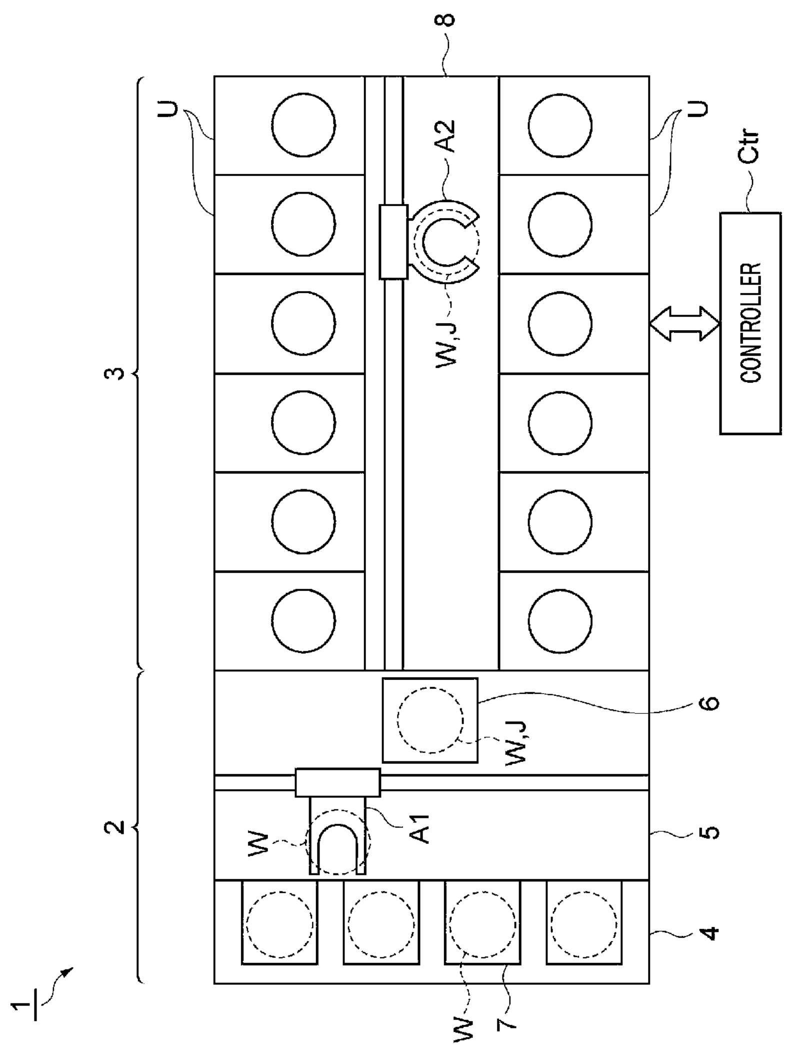
FIG. 1 is a plan view schematically illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same functions will be assigned same reference numerals, and redundant description thereof will be omitted. Further, in the present specification, when referring to the top, bottom, right, and left of the drawings, the directions of the symbols in the drawings shall be used as a reference.

Substrate processing system First, referring to FIG. 1, a configuration of a substrate processing system 1 (substrate processing apparatus) configured to process a substrate W will be explained. The substrate processing system 1 includes a carry-in/out station 2, a processing station 3, and a controller Ctr (control unit). The carry-in/out station 2 and the processing station 3 may be arranged in a row in a horizontal direction, for example.

The substrate W may have a circular plate shape, or may have a plate shape other than the circular shape, such as a polygonal shape. The substrate W may have a groove portion where a part of the substrate W is cut out. The groove portion may be, by way of example, a notch (a U-shaped or V-shaped groove, or the like), or may be a straight line-shaped portion (a so-called orientation flat) extending in a straight line shape. The substrate W may be, by way of non-limiting example, a semiconductor substrate (silicon wafer), a glass substrate, a mask substrate, a FPD (Flat Panel Display) substrate, or any of various other types of substrates. The substrate W may have a diameter ranging from, e.g., about 200 mm to about 450 mm.

The carry-in/out station 2 includes a placing section 4, a carry-in/out section 5, and the shelf unit 6 (accommodation chamber). The placing section 4 includes a plurality of placement tables (not shown) arranged in a width direction (an up-and-down direction in FIG. 1) thereof. Each placement table is configured to place a carrier 7 thereon. The carrier 7 is configured to accommodate at least one substrate W in a sealed state. The carrier 7 includes an opening/closing door (not shown) through which the substrate W is carried in and out.

The carry-in/out section 5 is disposed adjacent to the placing section 4 in a direction in which the carry-in/out station 2 and the processing station 3 are arranged (in a left-and-right direction in FIG. 1). The carry-in/out section 5 includes an opening/closing door (not shown) that is provided for the placing section 4. With the carrier 7 placed on the placing section 4, both the opening/closing door of the carrier 7 and the opening/closing door of the carry-in/out section 5 are opened, allowing the inside of the carry-in/out section 5 and the inside of the carrier 7 to communicate with each other.

The carry-in/out section 5 incorporates therein a transfer arm A1 and the shelf unit 6. The transfer arm A1 is configured to be movable horizontally in a width direction of the carry-in/out section 5, movable up and down in a vertical direction, and pivotable around a vertical axis. The transfer arm A1 is configured to take out the substrate W from the carrier 7 to hand it over to the shelf unit 6, and, also, configured to receive the substrate W from the shelf unit 6 to return it back into the carrier 7. The shelf unit 6 is located in the vicinity of the processing station 3, and is configured to accommodate therein the substrate W and an inspection substrate J (which is to be described in detail later).

The processing station 3 includes a transfer section 8 and a plurality of liquid processing units U. The transfer section 8 extends horizontally in the direction in which the carry-in/out station 2 and the processing station 3 are arranged (the left-and-right direction in FIG. 1), for example. The transfer section 8 has a transfer arm A2 (transfer unit) provided therein. The transfer arm A2 is configured to be movable in a lengthwise direction of the transfer section 8, movable up and down in a vertical direction, and pivotable around a vertical axis. The transfer arm A2 is configured to take out the substrate W or the inspection substrate J from the shelf unit 6 to hand it over to the liquid processing unit U, and, also, configured to receive the substrate W or the inspection substrate J from the liquid processing unit U to return it back into the shelf unit 6.

Liquid Processing Unit

Figure 2:
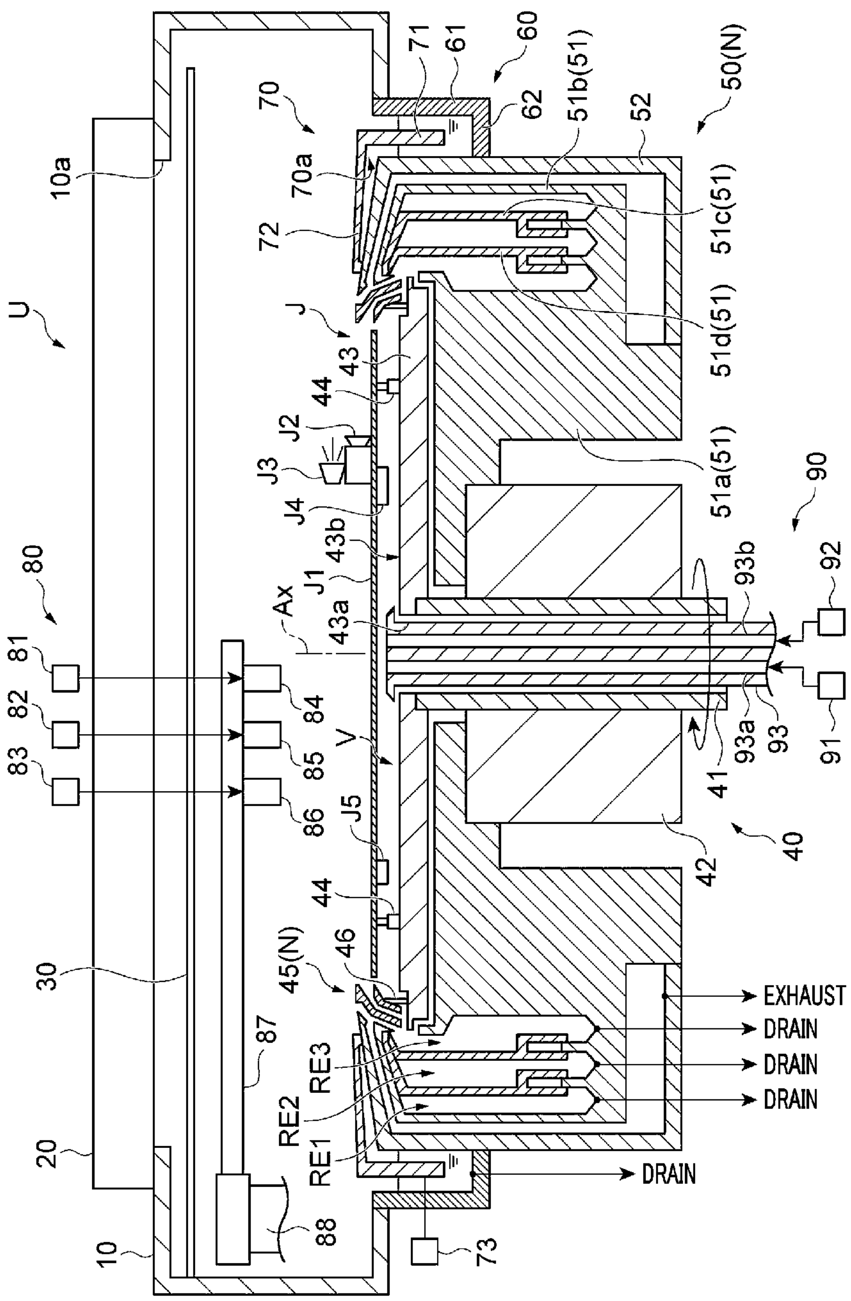
FIG. 2 is a side view schematically illustrating an example of a liquid processing unit.

Now, referring to FIG. 2, the liquid processing unit U will be explained in detail. The liquid processing unit U includes a chamber 10, a blower 20, a rectifier 30, a rotating/holding unit 40, a recovery cup 50 (a cup member, an outer cup body), and a cleaning cup 60 (a cup member), a mist guard 70 (a cup member), an upper supply 80 (a processing liquid supply, a cleaning liquid supply), and a lower supply 90.

The chamber 10 is configured such that a processing of the substrate W by a processing liquid or the like is performed therein. A non-illustrated carry-in/out opening is formed in a sidewall of the chamber 10. The substrate W is transferred to the inside of the chamber 10 and carried out from the chamber 10 by a transfer arm A2 through this carry-in/out opening.

The blower 20 is provided so as to cover an opening 10*a* formed in a ceiling wall of the chamber 10. The blower 20 is configured to form a descending flow in the chamber 10 based on a signal from the controller Ctr.

The rectifier 30 is disposed at an upper portion in the chamber 10 and extends horizontally so as to partition the internal space of the chamber 10 vertically. The rectifier 30 is a plate-shaped body provided with a large number of holes, and it may be, by way of non-limiting example, a punched metal, an extended metal, a wire mesh, or the like. The rectifier 30 is configured to rectify the descending flow formed by the blower 20 to evenly distribute the descending flow in the chamber 10 below the rectifier 30.

The rotating/holding unit 40 includes a rotary shaft 41, a driving unit 42, a supporting plate 43 (holder), a plurality of supporting pins 44 (holders), and an inner cup body 45 (a cup member). The rotary shaft 41 is a hollow tubular member extending along a vertical direction. The rotary shaft 41 is configured to be rotatable around a rotation axis Ax.

The driving unit 42 is connected to the rotary shaft 41. The driving unit 42 is configured to operate based on an operation signal from the controller Ctr to rotate the rotary shaft 41. The driving unit 42 may be, for example, a power source such as an electric motor.

The supporting plate 43 is, for example, a flat plate having an annular shape, and it extends horizontally. That is, a through hole 43*a* is formed at a central portion of the supporting plate 43. An inner peripheral portion of the supporting plate 43 is connected to a leading end of the rotary shaft 41. Thus, the supporting plate 43 is configured to be rotated around the rotation axis Ax as the rotary shaft 41 is rotated.

The plurality of supporting pins 44 are provided at the supporting plate 43 so as to be protruded upwards from a top surface 43*b* of the supporting plate 43. The plurality of supporting pins 44 are configured to support the substrate W in a substantially horizontal manner as leading ends thereof come into contact with a rear surface of the substrate W. Each of the plurality of supporting pins 44 may have, for example, a columnar shape or a frustum shape. Near an outer periphery of the supporting plate 43, the supporting pins 44 may be arranged at a substantially equal distance therebetween so that they may form a circle as a whole when viewed from above. By way of example, when the number of the supporting pins 44 is twelve, these supporting pins 44 may be arranged at an angular distance of about 30°.

The inner cup body 45 has a ring shape (for example, a circular ring shape), and is connected to the supporting plate 43 by a plurality of connecting member 46 so as to be positioned above the supporting plate 43 while being spaced apart therefrom. The inner cup body 45 is configured to surround the substrate W supported by the plurality of supporting pins 44 from the outside thereof. Thus, the inner cup body 45 is configured to be rotated around the rotation axis Ax of the rotary shaft 41 as the rotary shaft 41 is rotated. Since a gap exists between the inner cup body 45 and the supporting plate 43, a liquid supplied to the substrate W flows out of the inner cup body 45 and the supporting plate 43 through the gap.

The recovery cup 50 is disposed so as to surround the rotating/holding unit 40 from the outside thereof. While the rotating/holding unit 40 is configured to be rotatable, the recovery cup 50 is kept stationary without being rotated. As illustrated in FIG. 2, the recovery cup 50 may be fixed to the driving unit 42. The recovery cup 50 includes a drain cup 51 positioned inside; and an exhaust cup 52 disposed so as to surround the drain cup 51 from the outside thereof.

The drain cup 51 includes an inner peripheral portion 51*a*, a drain cup main body 51*b*, a movable cup 51*c*, and a movable cup 51*d*. The inner peripheral portion 51*a* is located below the supporting plate 43 so as to extend along a bottom surface of the supporting plate 43. The drain cup main body 51*b* forms a cylindrical space communicating with the gap between the inner cup body 45 and the supporting plate 43. The movable cup 51*c* and the movable cup 51*d* are disposed in the cylindrical space.

The movable cup 51*c* is located inside the drain cup main body 51*b* and forms a cylindrical liquid reservoir RE1 between the drain cup main body 51*b* and itself. The liquid reservoir RE1 is configured to collect and store the processing liquid scattered from a surface of the substrate W during a substrate processing. A pipeline for draining the collected processing liquid to the outside of the liquid processing unit U is connected to a lower end portion of the liquid reservoir RE1.

The movable cup 51*c* is connected to a non-illustrated driving source, and is configured to be movable up and down. When the movable cup 51*c* is located at a raised position (see FIG. 2), an upper portion of the movable cup 51*c* comes into contact with an upper portion of the drain cup main body 51*b*, so that the liquid reservoir RE1 is closed. On the other hand, when the movable cup 51*c* is located at a lowered position (not shown), the upper portion of the movable cup 51*c* is spaced apart from the upper portion of the drain cup main body 51*b*, so that the liquid reservoir RE1 is allowed to communicate with the outside.

The movable cup 51*d* is located inside the movable cup 51*c*, and forms a cylindrical liquid reservoir RE2 between the movable cup 51*c* and itself and also forms a cylindrical liquid reservoir RE3 between the inner peripheral portion 51*a* and itself. Each of the liquid reservoirs RE2 and RE3 is configured to collect and store the processing liquid scattered from the surface of the substrate W during the substrate processing. Pipelines for draining the collected processing liquid to the outside of the liquid processing unit U are respectively connected to lower end portions of the liquid reservoirs RE2 and RE3.

The movable cup 51*d* is connected to a non-illustrated driving source, and is configured to be movable up and down. When both of the movable cups 51*c* and 51*d* are located at raised positions (see FIG. 2), the upper portion of the movable cup 51*d* comes into contact with the upper portion of the movable cup 51*c*, so that the liquid reservoir RE2 is closed and the liquid reservoir RE3 is allowed to communicate with the outside. On the other hand, when the movable cup 51*c* is located at the raised position and the movable cup 51*d* is located at a lowered position (not shown), the upper portion of the movable cup 51*d* is spaced apart from the upper portion of the movable cup 51*c*, so that the liquid reservoir RE2 communicates with the outside, whereas the liquid reservoir RE3 is closed.

The exhaust cup 52 forms a cylindrical space between the drain cup 51 and itself, and this space is regulated to a negative pressure. A lower end portion of the exhaust cup 52 is connected with a pipeline for sucking in an atmosphere near the inner cup body 45 and exhausting it to the outside of the liquid processing unit U.

The cleaning cup 60 is configured to store a cleaning liquid therein. The cleaning cup 60 has a cylindrical shape surrounding the exhaust cup 52 from the outside thereof, and is extended so as to connect a lower end portion of the chamber 10 and the exhaust cup 52. For example, an inner space (a cleaning liquid storage space) of the cleaning cup 60 may be a space surrounded by the cleaning cup 60 and upper ends of the exhaust cup 52. As illustrated in FIG. 2, the cleaning cup 60 may have a cylindrical peripheral wall portion 61 extending in a vertical direction; and an annular bottom wall portion 62 extending radially inwards (toward the recovery cup 50 side) from a lower end of the peripheral wall portion 61 in a horizontal direction. A pipeline for draining the used cleaning liquid to the outside of the liquid processing unit U is connected to a lower end portion of the cleaning cup 60.

The mist guard 70 is disposed so as to surround the recovery cup 50 from the outside thereof. That is, the rotating/holding unit 40 and the recovery cup 50 are located inside the mist guard 70. As illustrated in FIG. 2, the mist guard 70 may include a cylindrical portion 71 extending in a vertical direction and an annular protruding portion 72 extending radially inwards (toward the recovery cup 50 side) from an upper end of the cylindrical portion 71 in a horizontal direction.

The mist guard 70 is connected to a driving unit 73 and is configured to be movable up and down in a vertical direction. The mist guard 70 is movable up and down between, for example, a lowered position (see FIG. 2) where at least a lower portion of the cylindrical portion 71 is located within the cleaning cup 60 and a raised position (not shown) where the entire or substantially the entire cylindrical portion 71 is exposed from the cleaning cup 60. At the lowered position, at least the lower portion of the cylindrical portion 71 is immersed in the cleaning liquid in the state that the cleaning liquid is stored in a storage space within the cleaning cup 60. At the raised position, mist generated as the processing liquid (to be described later) supplied to the substrate W is scattered to the vicinity thereof adheres to an inner surface 70*a* of the mist guard 70. With this configuration, the mist guard 70 suppresses the mist from adhering to an inner wall of the chamber 10.

The upper supply 80 is configured to supply a plurality of different types of processing liquids to the surface of the substrate W. The upper supply 80 includes supplies 81 to 83, nozzles 84 to 86, an arm 87 (holding arm), and a driving unit 88.

The supply 81 includes a liquid source, a valve, a pump, and so forth that are not shown, and is configured to supply a liquid L1 downwards from the nozzle 84 based on a signal from the controller Ctr. The liquid L1 may be an alkaline liquid. For example, the liquid L1 may be used as a chemical liquid configured to process the substrate W (e.g., removal of contaminants or foreign matters, etching, etc.), and may be used as a cleaning liquid configured to clean the inner surface 70*a* of the mist guard 70 and the inner wall surface of the chamber 10. The alkaline chemical liquid may contain, by way of non-limiting example, a SC-1 solution (a mixture of ammonia, hydrogen peroxide and pure water), hydrogen peroxide, or the like.

The supply 82 includes a liquid source, a valve, a pump, and so forth that are not shown, and is configured to supply a liquid L2 downwards from the nozzle 85 based on a signal from the controller Ctr. The liquid L2 may be an acidic liquid. For example, the liquid L2 may be used as a chemical liquid configured to process the substrate W (e.g., removal of contaminants or foreign matter, etching, etc.), and may be used as a cleaning liquid configured to clean the inner surface 70*a* of the mist guard 70 and the inner wall surface of the chamber 10. The acidic chemical liquid may include, by way of non-limiting example, a SC-2 solution (a mixture of hydrochloric acid, hydrogen peroxide, and pure water), SPM (a mixture of sulfuric acid, hydrogen peroxide, and pure water), a HF liquid (hydrofluoric acid), a DHF liquid (dilute hydrofluoric acid), a $HF/HNO_3$ solution (a mixture of hydrofluoric acid and nitric acid), sulfuric acid, or the like.

The supply 83 includes a liquid source, a valve, a pump, and so forth that are not shown, and is configured to supply a liquid L3 downwards from the nozzle 86 based on a signal from the controller Ctr. For example, the liquid L3 may be used as a cleaning liquid configured to clean the substrate W and the inner surface 70*a* of the mist guard 70. The liquid L3 may be water. The water may include, for example, pure water (DIW: deionized water), ozone water, carbonated water ($CO_2$ water), ammonia water, or the like. The water may be cold water (for example, about 10° C. or less), room-temperature water (for example, about 10° C. to about 30° C.), or hot water (for example, about 30° C. or higher).

The nozzles 84 to 86 are fastened to the arm 87 at a preset interval therebetween. The arm 87 is located in a space above the rotating/holding unit 40. The driving unit 88 is connected to the arm 87, and is configured to move the arm 87 up and down based on a signal from the controller Ctr and also configured to move the arm 87 horizontally above the rotating/holding unit 40. When the liquids L1 to L3 are discharged from the nozzles 84 to 86 onto the surface of the substrate W, the nozzles 84 to 86 are moved along with the arm 87 so that the nozzles 84 to 86 may be located above the substrate W to allow discharge openings thereof to be directed toward the surface of the substrate W.

The lower supply 90 includes supplies 91 and 92 and a nozzle 93. The supply 91 includes a liquid source, a valve, a pump, and so forth that are not shown, and is configured to supply a liquid L4 upwards through a flow path 93*a* formed within the nozzle 93 based on a signal from the controller Ctr. The liquid L4 may be any one of the liquids L1 to L3 described above. The supply 92 includes a gas source, valve, pump, and so forth that are not shown, and is configured to supply a drying gas G upwards through a flow path 93*b* formed within the nozzle 93 based on a signal from the controller Ctr. The drying gas G may be, by way of non-limiting example, an inert gas (e.g., a nitrogen gas).

Inspection Substrate

The inspection substrate J is configured to inspect the states of the inner cup body 45 and the recovery cup 50 (hereinafter, simply referred to as "cup member N"). The inspection substrate J includes, as illustrated in FIG. 2, a base J1, an imaging unit J2, an illuminator J3, a battery J4, and a communication unit J5. Like the substrate W, the base J1 may have a disk shape, or may have a plate shape other than the circular shape, such as a polygon. The base J1 holds thereon the imaging unit J2, the illuminator J3, the battery J4, and the communication unit J5.

The imaging unit J2 is operated based on an operation signal from the controller Ctr, and is configured to image the cup member N. The imaging unit J2 may be, for example, a CCD camera or a CMOS camera. The imaging unit J2 is disposed on the base J1 and is directed toward an outer periphery of the base J1. The imaging unit J2 is configured such that an elevation thereof is adjustable by a non-illustrated driving unit. The elevation may be in a range of, e.g., 0° to 90°.

The illuminator J3 is operated based on an operation signal from the controller Ctr, and is configured to radiate light to the cup member N when the cup member N is imaged by the imaging unit J2. The illuminator J3 is disposed on the base J1. The illuminator J3 may be disposed near the imaging unit J2.

The battery J4 is configured to supply electric power to the electronic devices provided on the inspection substrate J. To charge the battery J4, a charging port may be provided at the shelf unit 6, for example. In this case, the battery J4 is charged through the charging port in the state that the inspection substrate J is retreated to the shelf unit 6 and kept therein. The way to charge the battery J4 may be contact type charging in which the charging is performed as the battery comes into contact with a metal terminal of the charging port, or non-contact type charging in which the electric power is transmitted to the battery J4 without passing through a metal terminal or the like.

The communication unit J5 is configured to be capable of communicating with the controller Ctr (for example, a processing unit M3 to be described later). The communication unit J5 is capable of receiving the operation signals for operating the imaging unit J2 and the illuminator J3 from the controller Ctr. The communication unit J5 is capable of transmitting data of the image taken by the imaging unit J2 to the controller Ctr. The way for the communication between the communication unit J5 and the controller Ctr is not particularly limited, and it may be, for example, wireless communication or wired communication (via a communication cable). As an example of the wireless communication, LTE (Long Term Evolution), LTE-A (LTE-Advanced), SUPER3G, IMT-Advanced, 4G, 5G, FRA (Future Radio Access), W-CDMA (registered trademark), GSM (registered trademark), CDMA2000, UMB (Ultra Mobile Broadband), IEEE 802.11 (Wi-Fi), IEEE 802.16 (WiMAX), IEEE 802.20, UWB, Bluetooth (registered trademark), or any of various other communication methods may be used.

Details of Controller

Figure 3:
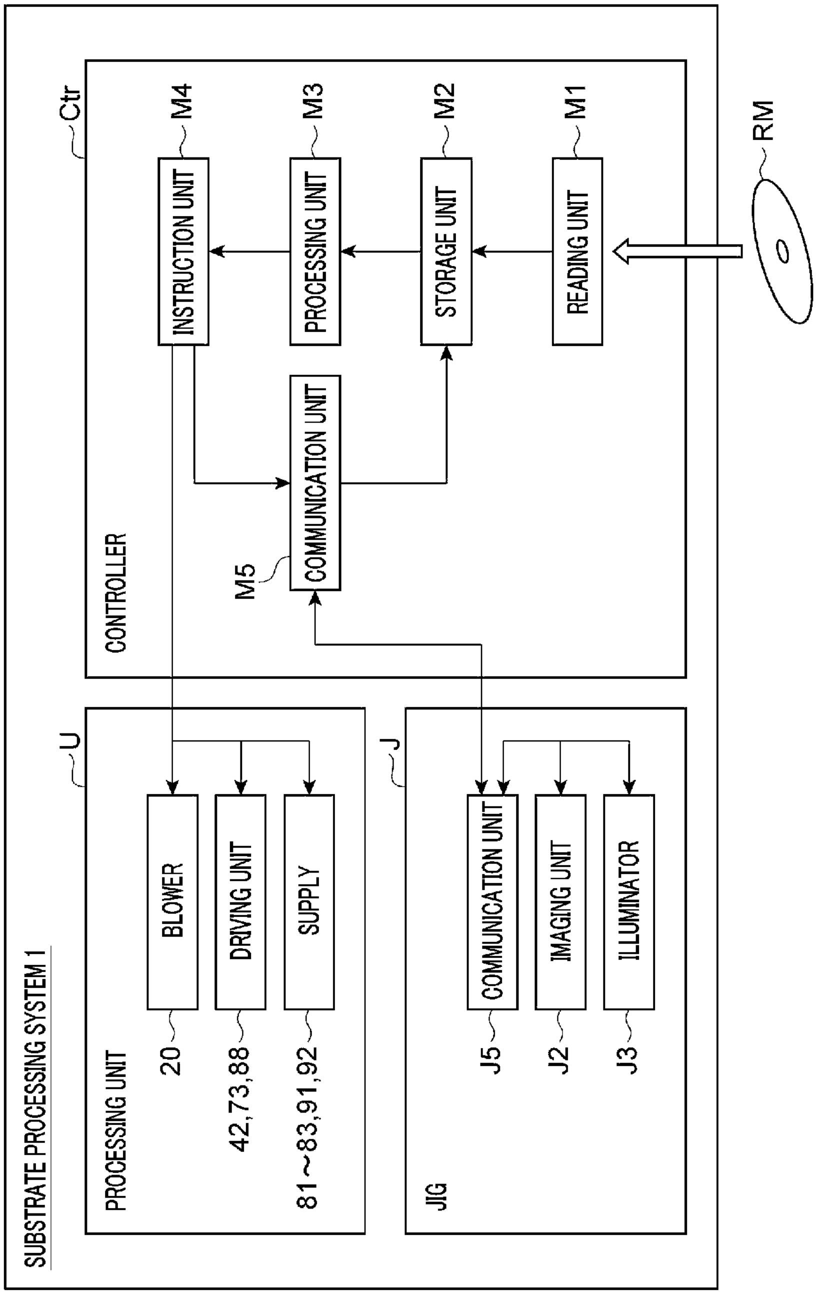
FIG. 3 is a block diagram illustrating an example of main components of the substrate processing system.

The controller Ctr is configured to control the substrate processing system 1 partially or in overall. As illustrated in FIG. 3, the controller Ctr has, as functional modules, a reading unit M1, a storage unit M2, the processing unit M3, an instruction unit M4, and a communication unit M5. These functional modules are nothing more than divisions of functions of the controller Ctr for convenience's sake, and it does not necessarily imply that hardware constituting the controller Ctr is divided into these modules. Each functional module is not limited to being implemented by execution of a program but may be implemented by a dedicated electric circuit (for example, a logic circuit) or an ASIC (Application Specific Integrated Circuit) as an integration of these electric circuits.

The reading unit M1 is configured to read out a program from a computer-readable recording medium RM. The recording medium RM stores thereon a program for operating the individual components of the substrate processing system 1. The recording medium RM may be, by way of example, but not limitation, a semiconductor memory, an optical recording disk, a magnetic recording disk, a magneto-optical recording disk, or the like. Further, in the following description, the individual components of the substrate processing system 1 may include individual components of the blower 20, the driving units 42, 73 and 88, the supplies 81 to 83, 91 and 92, the imaging unit J2, the illuminator J3 and the communication unit J5.

The storage unit M2 is configured to store therein various kinds of data. The storage unit M2 may store therein, for example, the program read out from the recording medium RM by the reading unit M1, setting data inputted from an operator via an external input device (not shown), and the like. The storage unit M2 may also store therein, for example, data of processing conditions (processing recipes) for processing the substrate W. The storage unit M2 may further store therein, for example, data of the image of the imaging unit J2 transmitted via the communication units J5 and M5.

The processing unit M3 is configured to process various types of data. By way of example, the processing unit M3 may generate signals for operating the individual components of the substrate processing system 1 based on the various types of data stored in the storage unit M2. As another example, the processing unit M3 may generate an operation signal for causing the imaging unit J2 to start or stop the imaging. For another example, the processing unit M3 may generate an operation signal for adjusting the elevation and a focus of the imaging unit J2. As still another example, the processing unit M3 may generate an operation signal for causing the illuminator J3 to start or stop the radiation of light.

The processing unit M3 may calculate a state of the cup member N based on the data of the image taken by the imaging unit J2, for example. The state of the cup member N may include, for example, a posture of the cup member (a height of the cup member N, an inclination of the cup member N, etc.), an abnormality on a surface of the cup member N, and so forth. When there is an abnormality on the surface of the cup member N, the processing unit M3 may set forth an alarm from a non-illustrated notification unit (for example, an alarm may be displayed on a display, or an alarming sound or an alarming message may be emitted from a speaker).

The instruction unit M4 is configured to transmit the operation signals generated in the processing unit M3 to the individual components of the substrate processing system 1. The communication unit M5 is configured to be capable of communicating with the communication unit J5, as stated above. When the communication unit M5 performs wireless communication with the communication unit J5, the communication unit M5 may be configured in the same way as the communication unit J5.

Figure 4:
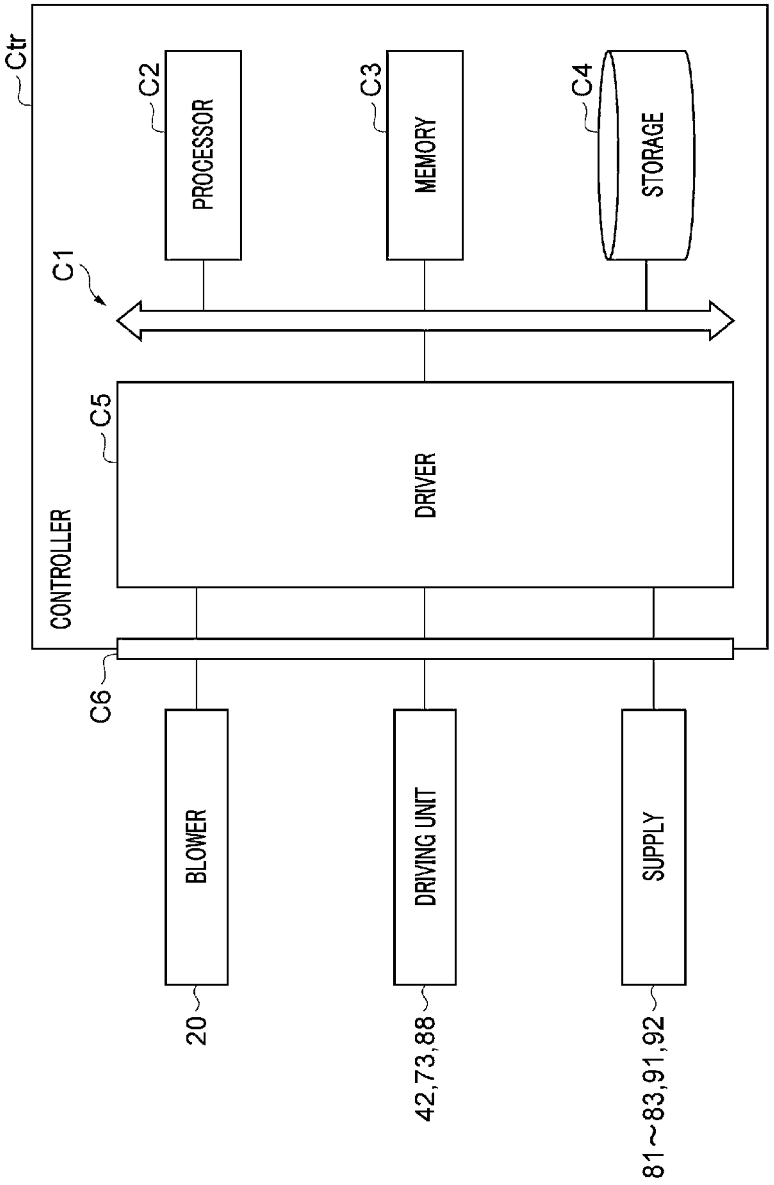
FIG. 4 is a schematic diagram illustrating an example of a hardware configuration of a controller.

The hardware of the controller Ctr may be composed of, by way of example, one or more control computers. The controller Ctr may include a circuit C1 as a hardware component, as shown in FIG. 4. The circuit C1 may be composed of electric circuit elements (circuitry). The circuit C1 may include, by way of example, a processor C2, a memory C3, a storage C4, a driver C5, and an input/output port C6.

The processor C2 may be configured to execute a program in cooperation with at least one of the memory C3 and the storage C4 and to perform an input/output of signals via the input/output port C6, thus realizing the aforementioned individual functional modules. The memory C3 and the storage C4 serve as the storage unit M2. The driver C5 may be a circuit configured to drive the individual components of the substrate processing system 1. The input/output port C6 may be configured to relay the input/output of the signals between the driver C5 and the individual components of the substrate processing system 1.

The substrate processing system 1 may be equipped with one controller Ctr or a controller group (control unit) composed of a multiple number of controllers Ctr. When the substrate processing system 1 is equipped with the controller group, each of the aforementioned functional modules may be implemented by a single controller Ctr or a combination of two or more controllers Ctr. If the controller Ctr is composed of a plurality of computers (circuits C1), each of the aforementioned functional modules may be implemented by a single computer (circuit C1) or a combination of two or more computers (circuits C1). The controller Ctr may include a plurality of processors C2. In this case, each of the aforementioned functional modules may be implemented by a single processor C2 or a combination of two or more processors C2.

Method of Inspecting State of Cup Member

Next, with reference to FIG. 5 to FIG. 9, an example method of inspecting the state of the cup member N will be explained. The following description will be provided for an example where the inspection is started in the state that the inspection substrate J is placed in the shelf unit 6. Further, the image taken by the imaging unit J2 may be a gray scale image or a color image.

First, the controller Ctr controls the transfer arm A2 to transfer the inspection substrate J from the shelf unit 6 to the liquid processing unit U. Then, the inspection substrate J is held by the rotating/holding unit 40 of the liquid processing unit U (see process S1 of FIG. 5).

Figure 5:
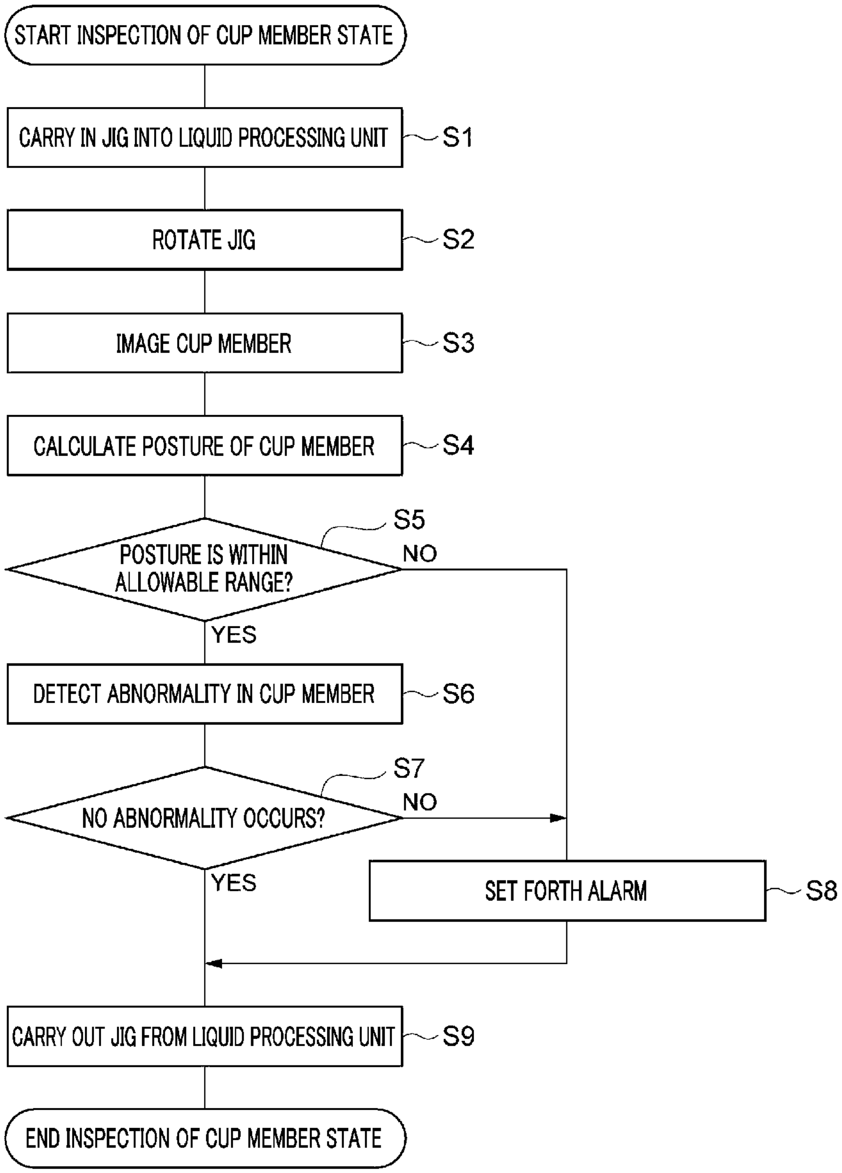
FIG. 5 is a flowchart for describing an example of a sequence of inspecting a state of a cup member.

Next, the controller Ctr controls the rotating/holding unit 40 to rotate the inspection substrate J via the rotating/holding unit 40 so that the imaging unit J2 for the cup member N is positioned at a predetermined imaging position P1 (see FIG. 6) (see process S2 of FIG. 5). Here, when the imaging unit J2 is already located at the imaging position P1 at the time when the inspection substrate J is handed over to the rotating/holding unit 40 from the transfer arm A2, the process S2 may not be performed.

Figure 7A:
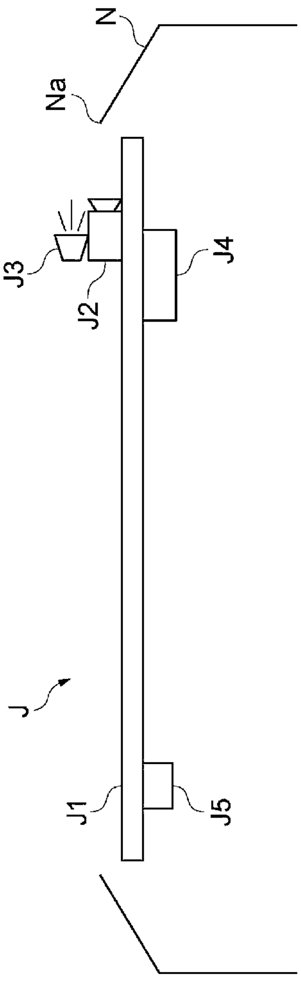
FIG. 7A and FIG. 7B are diagrams for describing a method of calculating a height of the cup member.

Next, the controller Ctr controls the imaging unit J2 and the illuminator J3 via the communication units M5 and J5, thus allowing the illuminator J3 to radiate the light to the cup member N and the imaging unit J2 to image the cup member N (see process S3 of FIG. 5). An example of the imaging of the cup member N by the imaging unit J2 is shown in FIG. 7A. As shown in FIG. 7A, the imaging unit J2 images a space closer to the cup member N than to an outer periphery of the base J1 so that an upper edge Na of the cup member N is included in a taken image. The data of the taken image is transmitted to the controller Ctr via the communication units M5 and J5. In addition, before the cup member N is imaged, the controller Ctr may control the imaging unit J2 via the communication units M5 and J5 to adjust the elevation and the focus of the imaging unit J2.

Figure 6:
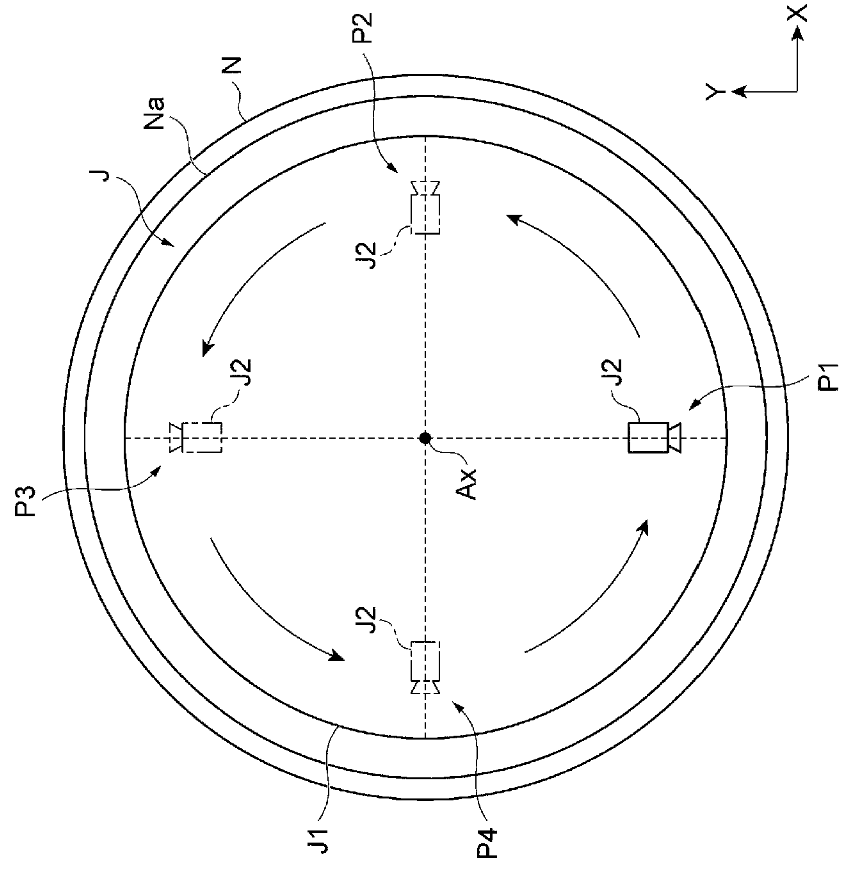
FIG. 6 is a top view of an inspection substrate for describing an example of adjustment of an imaging position.

The processes S2 and S3 may be repeated when necessary for the inspection. While varying the imaging position, the cup member N may be imaged by the imaging unit J2 from different directions. For example, as shown in FIG. 6, the imaging unit J2 may image the cup member N from different imaging positions P1 to P4 at an angular interval of approximately 90°. In this case, four images respectively taken from the imaging positions P1 to P4 are obtained. Alternatively, although not shown, the cup member N may be imaged by the imaging unit J2 from different imaging positions at an angular interval of approximately 15°. In this case, twenty four images respectively taken from the imaging positions are obtained. Still alternatively, although not shown, the cup member N may be imaged by the imaging unit J2 continuously, while rotating the inspection substrate J. In this case, an image (so-called panoramic image) for the entire circumference of the cup member N is obtained. Further, when imaging the cup member N from different directions while changing the imaging positions, these multiple imaging positions may be spaced apart from each other at a substantially equal interval therebetween in a rotational direction of the inspection substrate J (that is, may be spaced apart from each other at each preset angle), or the interval may not be uniform.

Next, the controller Ctr processes the data of the panoramic image of the cup member N, thus calculating the posture of the cup member N (see process S4 of FIG. 5). Here, an example where (A) the height of the cup member N and (B) the inclination of the cup member N are calculated as the posture of the cup member N will be discussed.

(A) Height of Cup Member N

Figure 7B:
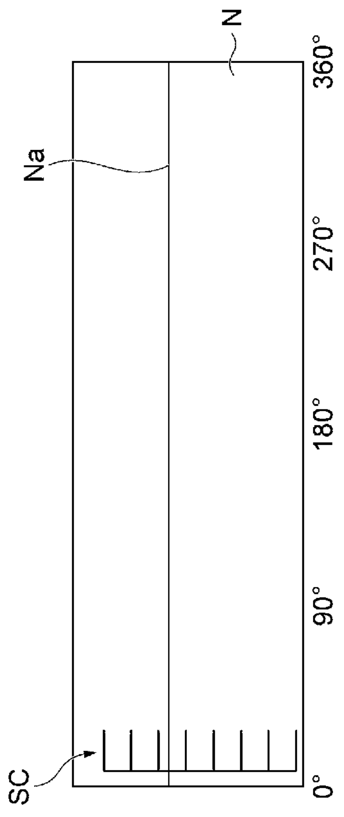

First, the upper edge Na of the cup member N is specified in the panoramic image (see FIG. 7B). To specify the upper edge Na of the cup member N, a method in which an operator observes the taken image and designates the upper edge Na of the cup member N, or a method in which the controller Ctr processes the taken image by using a commonly known edge detection technique and detects the upper edge Na of the cup member N based on the processed image may be employed.

Next, the height of the cup member N is obtained by calculating a linear distance between the upper edge Na of the cup member N and the surface of the base J1 in the panoramic image. Specifically, the controller Ctr may calculate the height (mm) of the upper edge Na of the cup member N by obtaining the number of pixels between the upper edge Na of the cup member N and the surface of the base J1 in the panoramic image and multiplying a previously acquired length per pixel (mm/pixel) thereto. Alternatively, as illustrated in FIG. 7B, a panoramic image obtained by imaging a scale SC and the cup member N at the same time may be used, and the height of the cup member N may be acquired as the operator reads the height of the upper edge Na of the cup member N by using the scale SC. In addition, the scale SC may be provided at the base J1 such that the scale SC is located near the cup member N and extends upwards from the surface of the base J1, or may be provided on a front surface of a lens of the imaging unit J2.

(B) Inclination of Cup Member N

Figure 8A:
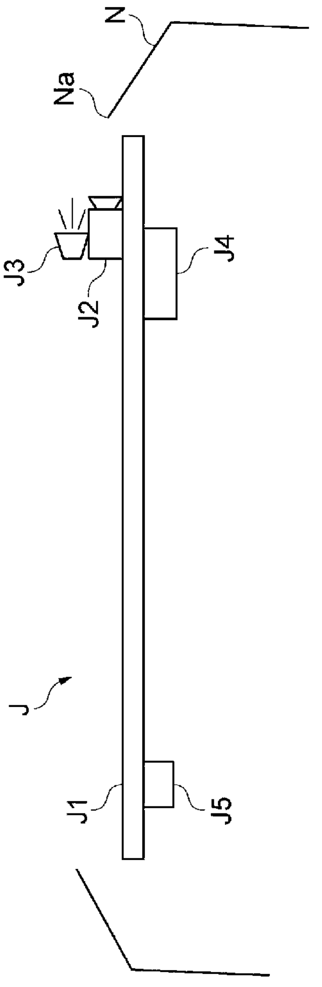
FIG. 8A and FIG. 8B are diagrams for describing a method of calculating an inclination of the cup member.
Figure 8B:
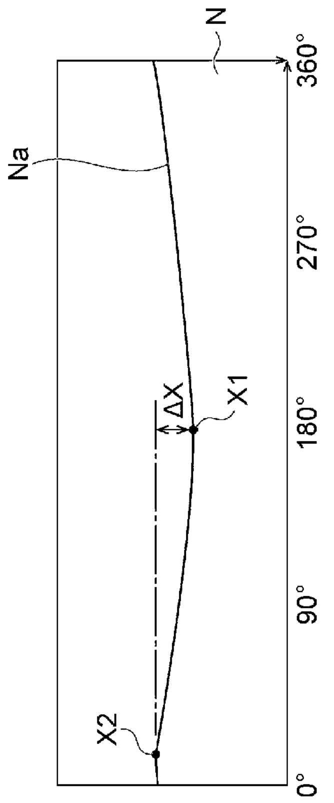

First, the upper edge Na of the cup member N is specified in the panoramic image (see FIG. 8B). The upper edge Na of the cup member N may be specified in the same way as described for the height of the cup member N.

Here, when the cup member N is not inclined as illustrated in FIG. 7A, the upper edge Na of the cup member N is expressed in the panoramic image as a straight line extending in a horizontal direction. On the other hand, when the cup member N is inclined as illustrated in FIG. 8A, the upper edge Na of the cup member N is expressed in the panoramic image as a curve. That is, a position showing the minimum value of the curve becomes a side where the inclination of the cup member N is low, and a position showing the maximum value of the curve becomes a side where the inclination of the cup member N is high.

Accordingly, the controller Ctr specifies an imaging position X1 (imaging angle) indicating the minimum value of the curve and an imaging position X2 (imaging angle) indicating the maximum value of the curve (see FIG. 8B). In this case, it can be determined that the cup member N is inclined downwards in a direction from the imaging position X2 toward the imaging position X1. In this way, the inclination direction of the cup member N is calculated. Further, the controller Ctr calculates the number of pixels of a difference (ΔX) between the maximum value and minimum value of the curve, and multiplies the previously obtained length per pixel (mm/pixel) thereto, whereby the inclination of the cup member N is calculated.

Next, the controller Ctr makes a determination on whether or not the posture of the cup member N (for example, the height of the cup member N, the inclination of the cup member N, etc.) calculated in the process S4 is within an allowable range (process S5 in FIG. 5). As a result of the determination in the process S5, if the posture of the cup member N is not within the allowable range (NO in process S5 in FIG. 5), the processing proceeds to a process S8, so that an alarm is set forth to notify that the cup member N needs to be adjusted. Based on this alarm, the operator may manually adjust the cup member N, or the controller Ctr may control the individual components of the liquid processing unit U (for example, a cup controller (not shown) configured to adjust the posture (height, inclination etc.) of the cup member N) to thereby allow the adjustment of the cup member N automatically. In this case, it becomes possible to perform maintenance of the cup member N efficiently. Thereafter, the controller Ctr controls the transfer arm A2 to carry out the inspection substrate J from the liquid processing unit U and transfer the inspection substrate J to the shelf unit 6 (see process S9 in FIG. 5).

Figure 9:
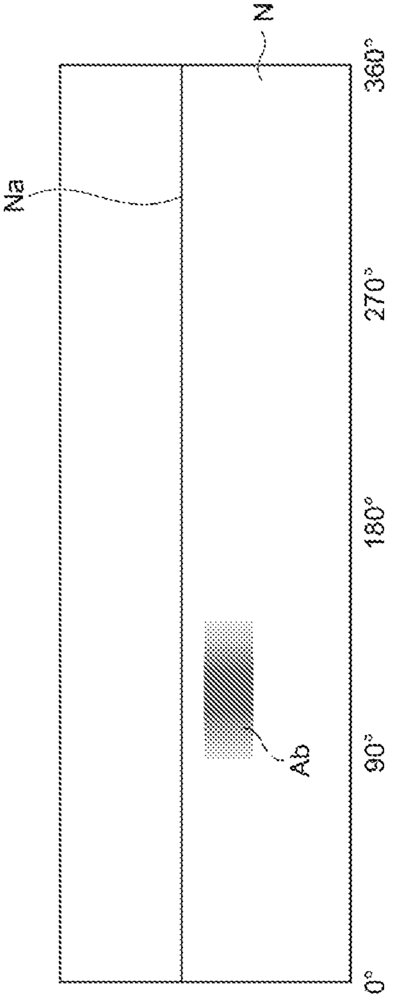
FIG. 9 is a diagram for describing a method of calculating an abnormality in the cup member, which illustrates an example of an image prepared by developing an image taken over the substantially entire circumference of the cup member into a plane.

Meanwhile, if it is determined in the process S5 that the posture of the cup member N is within the allowable range (YES in process S5 of FIG. 5), the controller Ctr detects presence or absence of an abnormality in the cup member N (see process S6 in FIG. 5). Hereinafter, as illustrated in FIG. 9, an example of detecting the presence or absence of an abnormality in the cup member N based on the panoramic image of the cup member N will be described.

First, a panoramic image of the cup member N with no abnormality is acquired as a reference image in advance. Next, the controller Ctr calculates a corrected image by calculating a difference between luminance values for each pixel located at corresponding coordinates in the reference image and a panoramic image to be inspected. Next, the controller Ctr processes the corrected image by using a commonly known edge detection technique, and calculates a size of a region where the edge is emphasized. Next, the controller Ctr determines whether or not the size of the region falls within a preset allowable range. When the size of the region is not within the preset allowable range, the controller Ctr makes a determination that an abnormality Ab (see FIG. 9) exists in the cup member N. Further, the reference image may be obtained by averaging the luminance values of all the pixels in the panoramic image to be inspected. Alternatively, the panoramic image to be inspected may be directly processed by using the commonly known edge detection technique without using the reference image.

If it is determined that the abnormality Ab occurs in the cup member N (NO in process S7 of FIG. 5), the controller proceeds to the process S8, and sets forth an alarm indicating that the cup member N has abnormality. If the alarm is set forth, the operator may replace the cup member N with a new cup member N. Alternatively, when the abnormality Ab of the cup member N is a deposit adhering to the cup member N, the controller Ctr may control the individual components of the liquid processing unit U to supply at least one of the liquids L1 to L4 to the cup member N to thereby remove the deposit from the cup member N.

Meanwhile, if it is determined in the process S7 that the cup member N does not have any abnormality Ab (YES in process S7 of FIG. 5), the processing proceeds to the process S9 in which the controller Ctr controls the transfer arm A2 to carry out the inspection substrate J from the liquid processing unit U and transfer the inspection substrate J to the shelf unit 6. Through these operations, the inspection of the state of the cup member N is completed.

In addition, when the inspection of the state of the cup member N of the one liquid processing unit U is finished, the inspection substrate J may not be returned to the shelf unit 6 but may be transferred to another liquid processing unit U to inspect a state of a cup member N of the corresponding liquid processing unit U. Furthermore, whenever a predetermined number of substrates W are processed in the liquid processing unit U, the inspection substrate may be periodically carried into the liquid processing unit U to inspect the stat of the cup member N of the liquid processing unit U. In this case, the controller Ctr may compare the current data of the state of the cup member N with the previous data of the state of the cup member N and determine whether the current state of the cup member N is within the preset allowable range. If the current state of the cup member N is not within the allowable range, the controller Ctr may set forth an alarm as in the process S8.

Effects

According to the above-described exemplary embodiment, by rotating the rotating/holding unit 40 in the state that the inspection substrate J is held by the rotating/holding unit, the position of the imaging unit J2 with respect to the cup member N is adjusted to the predetermined imaging position. For this reason, since there exists no obstacle between the imaging unit J2 and the cup member N as an imaging target, the cup member N may be imaged from an appropriate position. Therefore, it becomes possible to acquire the state of the cup member N with high precision.

According to the above-described exemplary embodiment, the cup member N is imaged from the multiple imaging positions. For this reason, it becomes possible to acquire the state of the cup member N more precisely.

According to the above-described exemplary embodiment, the cup member N may be imaged from the multiple imaging positions spaced apart from each other at the substantially equal interval in the rotational direction of the inspection substrate J. In this case, the outer peripheral surface of the cup member N is imaged over the substantially entire circumference thereof. For this reason, it becomes possible to acquire the state of the cup member N with higher precision.

According to the above-described exemplary embodiment, by image-processing the image taken by the imaging unit J2, presence or absence of the abnormality in the cup member N is detected. That is, presence or absence of a deposit or a flaw in the cup member N, presence or absence of deformation of the cup member N, and so forth are detected. Therefore, by adjusting (for example, replacing, cleaning, etc.) the cup member N based on the detection result, an influence on the substrate processing that might be caused by the abnormality in the cup member N can be eliminated in advance.

According to the above-described exemplary embodiment, by comparing the image of the cup member N obtained by the imaging unit J2 before the processing of the substrate W by the processing liquid is performed (that is, the image of the cup member N with no abnormality) with the image of the cup member N obtained by the imaging unit J2 after the processing of the substrate W by the processing liquid is performed, the presence or absence of the abnormality in the cup member N is detected. Through this comparison of the two taken images, a place where the abnormality occurs in the cup member N becomes more conspicuous. Therefore, it becomes possible to detect the presence or absence of the abnormality in the cup member N more accurately.

According to the above-described exemplary embodiment, if the abnormality in the cup member N is detected, the liquids L1 to L4 may be supplied to the cup member N. In this case, the abnormality (e.g., the deposit) in the cup member N is removed by the liquids L1 to L4. Therefore, the influence on the substrate processing that might be caused by the abnormality (for example, the deposit) in the cup member N can be eliminated in advance.

According to the above-described exemplary embodiment, by image-processing the image obtained by the imaging unit J2, the height of the cup member N or the inclination of the cup member N is detected. Therefore, it becomes possible to specify the posture of the cup member N based on the detection result.

According to the above-described exemplary embodiment, if it is determined that the height of the cup member N or the inclination of the cup member N falls out of the preset allowable range, an alarm is set forth. Therefore, the influence on the substrate processing that might be caused by the abnormal posture of the cup member can be eliminated in advance.

According to the above-described exemplary embodiment, the light is radiated from the illuminator J3 to the cup member N when the imaging unit J2 images the cup member N. Therefore, the cup member N can be imaged more clearly.

According to the above-described exemplary embodiment, the imaging unit J2 and the controller Ctr may be connected so as to communicate with each other wirelessly. In this case, since a communication cable need not be connected to the inspection substrate J, the rotation of the inspection substrate J by the rotating/holding unit 40 is less likely to be inhibited. Therefore, the degree of freedom in the imaging position of the cup member N can be increased.

According to the above-described exemplary embodiment, the inspection substrate J includes the battery J4 configured to supply the electric power to the imaging unit J2 and to be rechargeable. Therefore, since a power cable does not need to be connected to the inspection substrate J, the rotation of the inspection substrate J by the rotating/holding unit 40 is less likely to be inhibited. Therefore, it becomes possible to improve the degree of freedom in the imaging position of the cup member N.

According to the above-described exemplary embodiment, the inspection substrate J is transferred between the liquid processing unit U and the shelf unit 6 by the transfer arm A2. Thus, it is possible to retreat the inspection substrate J to the shelf unit 6 when the substrate processing by the liquid processing unit U is performed.

Modification Examples

It will be appreciated that the disclosure in the present specification is illustrative in all aspects and is not intended to be limiting. Various omissions, replacements and modifications may be made without departing from the scope and spirit of the claims.

(1) Although the above exemplary embodiment has been described for the example where the substrate processing system 1 is a substrate cleaning apparatus, the substrate processing system 1 may be a coating and developing apparatus. That is, the processing liquid supplied to the surface of the substrate W may be, by way of example, a coating liquid configured to form a film on the surface of the substrate W, or a developing liquid configured to develop a resist film.

Figure 10:
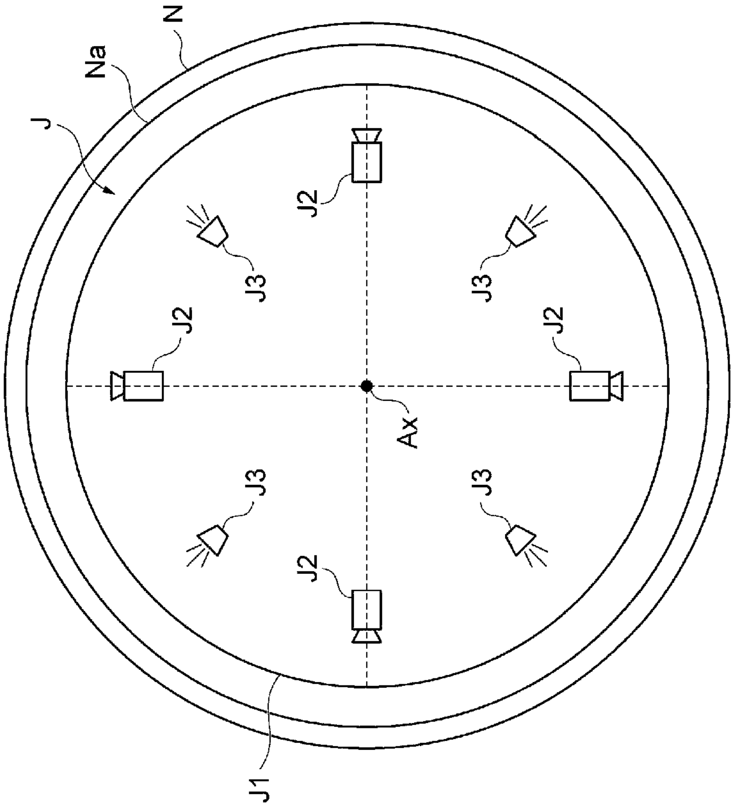
FIG. 10 is a side view illustrating another example of the inspection substrate.

(2) The inspection substrate J may not include the illuminator J3. Alternatively, the inspection substrate J may include a plurality of illuminators J3. In this case, as illustrated in FIG. 10, the illuminators J3 may be spaced apart from each other at an equal interval therebetween in the rotational direction of the inspection substrate J.

(3) The inspection substrate J may include a plurality of imaging units J2. In this case, as illustrated in FIG. 10, the plurality of imaging units J2 may be spaced apart from each other at a substantially equal interval therebetween in the rotational direction of the inspection substrate J. When the cup member N is imaged by the plurality of imaging units J2, multiple portions of the cup member N can be imaged at the same time by simply adjusting the positions of the plurality of imaging units J2 with respect to the cup member N to predetermined imaging positions. Therefore, the state of the cup member N can be acquired precisely and promptly.

(4) The imaging unit J2 may be disposed on the surface of the base J1 or embedded in the base J1.

(5) The rotating/holding unit 40 may be configured to attract and hold the substrate W.

(6) The controller Ctr may generate data of three-dimensional shape of the cup member N by image-processing the multiple images that are obtained by imaging the cup member N from different directions with the imaging unit J2 while changing the imaging position. In this case, based on the generated data of three-dimensional shape, the cup member N can be observed in more detail. Therefore, it becomes possible to acquire the state of the cup member N more precisely. Further, the data of three-dimensional shape of the cup member N may be obtained by using a non-contact type 3D scanner instead of the imaging unit J2.

(7) By imaging the mist guard 70 through the use of the inspection substrate J, the height or the inclination of the mist guard 70 may be calculated, and the abnormality of the mist guard 70 may be detected. At this time, the mist guard 70 may be located at the raised position. Further, when the abnormality (for example, the deposit) in the mist guard 70 is detected, the liquids L1 to L4 may be supplied to the mist guard 70. In this case, the abnormality (for example, the deposit) in the mist guard 70 are removed by the liquids L1 to L4. For this reason, it becomes possible to previously eliminate the influence on the substrate processing that might be caused by the abnormality (for example, the deposit) in the mist guard 70. In addition, the imaging unit J2 may image the mist guard 70 simultaneously with the inner cup body 45 and the recovery cup 50 or separately from the inner cup body 45 and the recovery cup 50 while changing the focus.

(8) An abnormality of the inner wall surface of the chamber 10 may be detected by imaging the inner wall surface of the chamber 10 through the use of the inspection substrate J. At this time, the mist guard 70 may be located at the lowered position. When the abnormality (for example, the deposit) on the inner wall surface of the chamber 10 is detected, the liquids L1 to L4 may be supplied to the inner wall surface of the chamber 10. In this case, the abnormality (for example, the deposit) on the inner wall surface of the chamber 10 is removed by the liquids L1 to L4. For this reason, it becomes possible to previously eliminate the influence on the substrate processing that might be caused by the abnormality (for example, the deposit) on the inner wall surface of the chamber 10. In addition, the imaging unit J2 may image the inner wall surface of the chamber 10 simultaneously with the inner cup body 45 and the recovery cup 50 or separately from the inner cup body 45 and the recovery cup 50 while changing the focus.

Other Examples

Example 1. A substrate processing apparatus includes an inspection substrate including a base and an imaging unit disposed at the base; a holder configured to hold a substrate or the inspection substrate; a driving unit configured to rotate the holder; a processing liquid supply configured to supply a processing liquid to the substrate held by the holder; a cup member configured to surround the holder from an outside thereof; and a controller. The controller is configured to perform: adjusting a position of the imaging unit with respect to the cup member to a predetermined first imaging position by controlling the driving unit to rotate the holder in a state that the inspection substrate is held by the holder; and imaging, after the adjusting of the position of the imaging unit to the first imaging position, an imaging target that is located in a space closer to the cup member than to an outer periphery of the base at the first imaging position by controlling the imaging unit. According to the substrate processing apparatus described in Patent Document 1, however, the imaging device is disposed above the processing liquid supply nozzle and the scattering prevention cup. For this reason, when it is attempted to image the vicinity of a leading end of the nozzle, there is a likelihood that the processing liquid supply nozzle and the scattering prevention cup may become an obstacle, causing an imaging target portion to be blocked or not to be uniformly radiated with light. In such a case, the imaging target portion may not be imaged clearly. Furthermore, since the imaging needs to be performed while avoiding the processing liquid supply nozzle and the scattering prevention cup and an imaging direction is limited to being from obliquely above, there is a risk that the range of imaging is delimited. According to the apparatus of Example 1, however, the position of the imaging unit with respect to the cup member is adjusted to the preset first imaging position by controlling the driving unit to rotate the holder in the state that the inspection substrate is held by the holder. Accordingly, since no obstacle exists between the imaging unit and the cup member to be imaged, the nozzle is imaged from an appropriate position. Therefore, it becomes possible to acquire a state of the cup member with high precision.

Example 2. In the substrate processing apparatus of Example 1, the cup member may include an inner cup body provided at the holder; an outer cup body surrounding the inner cup body from an outside thereof; and a mist guard, surrounding the outer cup body from an outside thereof, configured to be moved up and down. In this case, it becomes possible to acquire a state of each of the inner cup body, the outer cup body, and the mist guard with high precision.

Example 3. In the substrate processing apparatus of Example 1 or 2, the controller may be configured to perform: adjusting, after the imaging of the imaging target at the first imaging position, the position of the imaging unit with respect to the cup member to a second imaging position different from the first imaging position by controlling the driving unit to rotate the holder in the state that the inspection substrate is held by the holder; and imaging, after the adjusting of the position of the imaging unit to the second imaging position, the imaging target located in the space closer to the cup member than to the outer periphery of the base at the second imaging position by controlling the imaging unit. In this case, the cup member imaged from the multiple imaging positions. Thus, the state of the cup member can be acquired with higher precision.

Example 4. In the substrate processing apparatus of Example 3, the controller may be configured to perform the adjusting of the position of the imaging unit to the first imaging position, the imaging of the imaging target at the first imaging position, the adjusting of the position of the imaging unit to the second imaging position, and the imaging of the imaging target at the second imaging position sequentially, while controlling the driving unit to rotate the holder.

Example 5. In the substrate processing apparatus of Example 3 or 4, the controller may be configured to perform: adjusting, after the imaging of the imaging target at the second imaging position, the position of the imaging unit with respect to the cup member to a third imaging position different from the first imaging position and the second imaging position by controlling the driving unit to rotate the holder in the state that the inspection substrate is held by the holder; and imaging, after the adjusting of the position of the imaging unit to the third imaging position, the imaging target located in the space closer to the cup member than to the outer periphery of the base at the third imaging position by controlling the imaging unit. The first imaging position, the second imaging position, and the third imaging position may be spaced apart from each other at a substantially equal interval therebetween in a rotational direction of the inspection substrate. In this case, the cup member is imaged from the three imaging positions spaced apart from each other at the substantially equal distance therebetween in the rotational direction of the inspection substrate. That is, an outer peripheral surface of the cup member is imaged over the substantially entire circumference thereof. Therefore, the state of the nozzle can be acquired with higher precision.

Example 6. In the substrate processing apparatus of any one of Examples 1 to 5, the controller may be configured to perform detecting presence or absence of an abnormality in the cup member by image-processing an image obtained by the imaging unit. In this case, by adjusting (for example, replacing, cleaning, etc.) the cup member based on a detection result, an influence on the substrate processing that might be caused by the abnormality in the cup member can be eliminated in advance.

Example 7. In the substrate processing apparatus of Example 6, the detecting of the presence or absence of the abnormality in the cup member may include detecting the presence or absence of the abnormality in the cup member by comparing an image obtained by the imaging unit before a processing of the substrate with the processing liquid is performed and an image obtained by the imaging unit after the processing of the substrate with the processing liquid is performed. In this case, through the comparison of the two taken images, an abnormal portion of the cup member becomes more conspicuous. Therefore, it becomes possible to detect the presence or absence of the abnormality in the cup member more accurately.

Example 8. The substrate processing apparatus of Example 6 or 7 may further include a cleaning liquid supply configured to supply a cleaning liquid. The controller is configured to perform supplying the cleaning liquid to the cup member by controlling the cleaning liquid supply when the abnormality is detected in the detecting of the presence or absence of the abnormality in the cup member. In this case, the abnormality (for example, a deposit) in the cup member is removed by the cleaning liquid. Therefore, an influence on the substrate processing that might be caused by the abnormality (for example, the deposit) in the cup member can be eliminated in advance.

Example 9. In the substrate processing apparatus of any one of Examples 1 to 8, the controller may be configured to perform detecting a height of the cup member or an inclination of the cup member by image-processing an image obtained by the imaging unit. In this case, it becomes possible to specify a posture (height or inclination) of the cup member based on a detection result.

Example 10. In the substrate processing apparatus of Example 9, the controller may be configured to perform setting forth an alarm when it is determined that the height or the inclination of the cup member detected in the detecting of the height of the cup member or the inclination of the cup member falls out of a preset allowable range. In this case, an influence on the substrate processing that might be caused by the abnormal posture of the cup member can be eliminated in advance.

Example 11. The substrate processing apparatus of Example 9 or 10 may further include a cup driving unit configured to change the height or the inclination of the cup member. The controller may be configured to perform adjusting the height or the inclination of the cup member such that the height or the inclination of the cup member falls within a preset range by controlling the cup driving unit when it is determined that the height or the inclination of the cup member detected in the detecting of the height of the cup member or the inclination of the cup member falls out of the preset range In this case, since the controller automatically controls the posture of the cup member when a deviation is out of the range, it becomes possible to perform maintenance of the cup member efficiently.

Example 12. The substrate processing apparatus of any one of Examples 1 to 11 may further include a processing chamber configured to accommodate the holder, the driving unit, and the cup member therein. The controller may be configured to perform detecting presence or absence of a deposit adhering to an inner wall surface of the processing chamber by image-processing an image obtained by the imaging unit. Here, the inner wall surface of the processing chamber is located outside the cup member. Thus, if the imaging unit of the inspection substrate is directed toward the cup member, the inner wall surface of the processing chamber is also included in the imaging range of the imaging unit. For this reason, it is possible to image the inner wall surface of the processing chamber simultaneously with the cup member or separately from the cup member while changing a focus. In this case, by cleaning the inner wall surface of the processing chamber based on the detection result, it becomes possible to eliminate in advance an influence on the substrate processing that might be caused by the deposit on the inner wall surface of the processing chamber.

Example 13. In the substrate processing apparatus of any one of Examples 1 to 12, the inspection substrate may include an illuminator disposed at the base. The illuminator may be configured to radiate light to the imaging target when the imaging unit images the imaging target that is located in the space closer to the cup member than to the outer periphery of the base. In this case, the imaging target can be imaged more clearly.

Example 14. In the substrate processing apparatus of any one of Examples 1 to 13, the inspection substrate may include an additional imaging unit disposed at a position of the base different from where the imaging unit is disposed. In this case, the cup member is imaged by the multiple imaging units. For this reason, only by adjusting the positions of the imaging units with respect to the cup member to predetermined imaging position, it is possible to image multiple positions of the cup member simultaneously. Therefore, the state of the cup member can be acquired precisely and promptly.

Example 15. In the substrate processing apparatus of any one of Examples 1 to 14, the imaging unit and the controller may be connected to communicate with each other wirelessly. In this case, since there is no cables around the inspection substrate, rotation of the inspection substrate by the holder is not hindered. Therefore, it becomes possible to increase the degree of freedom in the imaging position of the cup member.

Example 16. In the substrate processing apparatus of any one of Examples 1 to 15, the inspection substrate may include a battery configured to supply electric power to the imaging unit and configured to be recharged. In this case, since a power cable does not need to be connected to the inspection substrate, the rotation of the inspection substrate by the holder is less likely to be inhibited. Therefore, it becomes possible to increase the degree of freedom in the imaging position of the cup member.

Example 17. In the substrate processing apparatus of any one of Examples 1 to 16, the substrate processing apparatus may further include a processing chamber configured to accommodate therein the holder, the driving unit, at least a part of the processing liquid supply, and the cup member; an accommodation chamber configured to accommodate therein the inspection substrate; and a transfer device configured to transfer the inspection substrate between the processing chamber and the accommodation chamber. In this case, when the substrate processing by the processing chamber is performed, it is possible to retreat the inspection substrate to the accommodation chamber.

Example 18. A substrate processing method includes holding, with a holder, an inspection substrate including a base and an imaging unit disposed at the base; adjusting, after the holding of the inspection substrate, a position of the imaging unit with respect to a cup member, which is configured to surround the holder from an outside thereof, to a predetermined first imaging position by rotating the holder; imaging, after the adjusting of the position of the imaging unit, an imaging target located in a space closer to the cup member than to an outer periphery of the base at the first imaging position; carrying out the inspection substrate from the holder after the imaging of the imaging target; holding a substrate with the holder after the carrying out of the inspection substrate; and processing the substrate by supplying a processing liquid to the substrate after the holding of the substrate with the holder. In this case, the same effects as in the substrate processing apparatus of Example 1 can be achieved.

With the substrate processing apparatus and the substrate processing method according to the exemplary embodiment, it is possible to acquire the state of the cup member with high precision.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:

an inspection substrate including a base and an imaging unit disposed at the base;

a holder configured to hold a substrate or the inspection substrate;

a driving unit configured to rotate the holder;

a processing liquid supply configured to supply a processing liquid to the substrate held by the holder, a cup member configured to surround the holder from an outside thereof; and a controller, wherein the imaging unit is disposed at a position for imaging the cup member, wherein the controller is configured to perform:

adjusting the position of the imaging unit to a predetermined first imaging position corresponding to a specific circumferential position of the cup member, by controlling the driving unit to rotate the holder in a state that the inspection substrate is held by the holder; and imaging, after the adjusting of the position of the imaging unit to the first imaging position, an imaging target that is located in a space closer to the cup member than to an outer periphery of the base at the first imaging position by controlling the imaging unit.

2. The substrate processing apparatus of claim 1, wherein the cup member comprises:

an inner cup body provided at the holder;

an outer cup body surrounding the inner cup body from an outside thereof; and a mist guard, surrounding the outer cup body from an outside thereof, configured to be moved up and down.

3. The substrate processing apparatus of claim 2, wherein the controller is configured to perform:

adjusting, after the imaging of the imaging target at the first imaging position, the position of the imaging unit with respect to the cup member to a second imaging position different from the first imaging position by controlling the driving unit to rotate the holder in the state that the inspection substrate is held by the holder; and imaging, after the adjusting of the position of the imaging unit to the second imaging position, the imaging target located in the space closer to the cup member than to the outer periphery of the base at the second imaging position by controlling the imaging unit.

4. The substrate processing apparatus of claim 1, wherein the controller is configured to perform:

adjusting, after the imaging of the imaging target at the first imaging position, the position of the imaging unit with respect to the cup member to a second imaging position different from the first imaging position by controlling the driving unit to rotate the holder in the state that the inspection substrate is held by the holder; and imaging, after the adjusting of the position of the imaging unit to the second imaging position, the imaging target located in the space closer to the cup member than to the outer periphery of the base at the second imaging position by controlling the imaging unit.

5. The substrate processing apparatus of claim 4, wherein the controller is configured to perform the adjusting of the position of the imaging unit to the first imaging position, the imaging of the imaging target at the first imaging position, the adjusting of the position of the imaging unit to the second imaging position, and the imaging of the imaging target at the second imaging position sequentially, while controlling the driving unit to rotate the holder.

6. The substrate processing apparatus of claim 5, wherein the controller is configured to perform:

adjusting, after the imaging of the imaging target at the second imaging position, the position of the imaging unit with respect to the cup member to a third imaging position different from the first imaging position and the second imaging position by controlling the driving unit to rotate the holder in the state that the inspection substrate is held by the holder; and imaging, after the adjusting of the position of the imaging unit to the third imaging position, the imaging target located in the space closer to the cup member than to the outer periphery of the base at the third imaging position by controlling the imaging unit, and wherein the first imaging position, the second imaging position, and the third imaging position are spaced apart from each other at a substantially equal interval therebetween in a rotational direction of the inspection substrate.

7. The substrate processing apparatus of claim 4, wherein the controller is configured to perform:

adjusting, after the imaging of the imaging target at the second imaging position, the position of the imaging unit with respect to the cup member to a third imaging position different from the first imaging position and the second imaging position by controlling the driving unit to rotate the holder in the state that the inspection substrate is held by the holder; and imaging, after the adjusting of the position of the imaging unit to the third imaging position, the imaging target located in the space closer to the cup member than to the outer periphery of the base at the third imaging position by controlling the imaging unit, and wherein the first imaging position, the second imaging position, and the third imaging position are spaced apart from each other at a substantially equal interval therebetween in a rotational direction of the inspection substrate.

8. The substrate processing apparatus of claim 1, wherein the controller is configured to perform detecting presence or absence of an abnormality in the cup member by image-processing an image obtained by the imaging unit.

9. The substrate processing apparatus of claim 8, wherein the detecting of the presence or absence of the abnormality in the cup member comprises detecting the presence or absence of the abnormality in the cup member by comparing an image obtained by the imaging unit before a processing of the substrate with the processing liquid is performed and an image obtained by the imaging unit after the processing of the substrate with the processing liquid is performed.

10. The substrate processing apparatus of claim 8, further comprising:

a cleaning liquid supply configured to supply a cleaning liquid, wherein the controller is configured to perform supplying the cleaning liquid to the cup member by controlling the cleaning liquid supply when the abnormality is detected in the detecting of the presence or absence of the abnormality in the cup member.

11. The substrate processing apparatus of claim 1, wherein the controller is configured to perform detecting a height of the cup member or an inclination of the cup member by image-processing an image obtained by the imaging unit.

12. The substrate processing apparatus of claim 11, wherein the controller is configured to perform setting forth an alarm when it is determined that the height or the inclination of the cup member detected in the detecting of the height of the cup member or the inclination of the cup member falls out of a preset range.

13. The substrate processing apparatus of claim 11, further comprising:

a cup driving unit configured to change the height or the inclination of the cup member, wherein the controller is configured to perform adjusting the height or the inclination of the cup member such that the height or the inclination of the cup member falls within a preset range by controlling the cup driving unit when it is determined that the height or the inclination of the cup member detected in the detecting of the height of the cup member or the inclination of the cup member falls out of the preset range.

14. The substrate processing apparatus of claim 1, further comprising:

a processing chamber configured to accommodate the holder, the driving unit, and the cup member therein, wherein the controller is configured to perform detecting presence or absence of a deposit adhering to an inner wall surface of the processing chamber by image-processing an image obtained by the imaging unit.

15. The substrate processing apparatus of claim 1, wherein the inspection substrate comprises an illuminator disposed at the base, and the illuminator is configured to radiate light to the imaging target when the imaging unit images the imaging target that is located in the space closer to the cup member than to the outer periphery of the base.

16. The substrate processing apparatus of claim 1, wherein the inspection substrate comprises an additional imaging unit disposed at a position of the base different from where the imaging unit is disposed.

17. The substrate processing apparatus of claim 1, wherein the imaging unit and the controller are connected to communicate with each other wirelessly.

18. The substrate processing apparatus of claim 1, wherein the inspection substrate comprises a battery configured to supply electric power to the imaging unit and configured to be recharged.

19. The substrate processing apparatus of claim 1, further comprising:

a processing chamber configured to accommodate therein the holder, the driving unit, at least a part of the processing liquid supply, and the cup member;

an accommodation chamber configured to accommodate therein the inspection substrate; and a transfer device configured to transfer the inspection substrate between the processing chamber and the accommodation chamber.

20. A substrate processing method, comprising:

holding, with a holder, an inspection substrate comprising a base and an imaging unit disposed at the base, wherein the imaging unit is disposed at a position for imaging the cup member which is configured to surround the holder from an outside thereof;

adjusting, after the holding of the inspection substrate, the position of the imaging unit with respect to the cup member, to a predetermined first imaging position corresponding to a specific circumferential position of the cup member by rotating the holder;

imaging, after the adjusting of the position of the imaging unit, an imaging target located in a space closer to the cup member than to an outer periphery of the base at the first imaging position;

carrying out the inspection substrate from the holder after the imaging of the imaging target;

holding a substrate with the holder after the carrying out of the inspection substrate; and processing the substrate by supplying a processing liquid to the substrate after the holding of the substrate with the holder.

* * * * *